(12) United States Patent
Asai et al.

(10) Patent No.: US 11,257,654 B2
(45) Date of Patent: Feb. 22, 2022

(54) ION MILLING APPARATUS

(71) Applicant: HITACHI HIGH-TECHNOLOGIES CORPORATION, Tokyo (JP)

(72) Inventors: Kengo Asai, Tokyo (JP); Hiroyasu Shichi, Tokyo (JP); Toru Iwaya, Tokyo (JP); Hisayuki Takasu, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 536 days.

(21) Appl. No.: 16/316,289

(22) PCT Filed: Jul. 14, 2016

(86) PCT No.: PCT/JP2016/070846
§ 371 (c)(1),
(2) Date: Jan. 8, 2019

(87) PCT Pub. No.: WO2018/011946
PCT Pub. Date: Jan. 18, 2018

(65) Prior Publication Data
US 2021/0287871 A1 Sep. 16, 2021

(51) Int. Cl.
*H01J 37/08* (2006.01)
*H01J 37/305* (2006.01)
*H01J 37/09* (2006.01)

(52) U.S. Cl.
CPC .............. *H01J 37/08* (2013.01); *H01J 37/09* (2013.01); *H01J 37/3053* (2013.01); *H01J 2237/0473* (2013.01)

(58) Field of Classification Search
CPC .......... H01J 37/08; H01J 37/09; H01J 37/305; H01J 37/3053; H01J 37/3056
See application file for complete search history.

(56) References Cited

U.S. PATENT DOCUMENTS

| 3,955,118 A | 5/1976 | Flemming |
| 5,559,337 A * | 9/1996 | Ito .......................... H01J 49/061 250/288 |
| 9,214,313 B2 * | 12/2015 | Matesa, Jr. ......... H01J 37/3056 |

(Continued)

FOREIGN PATENT DOCUMENTS

| CN | 105047511 A | 11/2015 |
| JP | 60-257053 A | 12/1985 |

(Continued)

OTHER PUBLICATIONS

Japanese Office Action dated Oct. 1, 2019 for the Japanese Patent Application No. 2018-527336 with English machine translation.

(Continued)

*Primary Examiner* — David E Smith
(74) *Attorney, Agent, or Firm* — Volpe Koenig

(57) ABSTRACT

To provide an ion milling apparatus adapted to suppress the contamination of a beam forming electrode. The ion milling apparatus includes: an ion gun containing therein a beam forming electrode for forming an ion beam; a specimen holder for fixing a specimen to be processed by irradiation of an ion beam; a mask for shielding a part of the specimen from the ion beam; and an ion gun controller for controlling the ion gun.

11 Claims, 8 Drawing Sheets

(56) References Cited

U.S. PATENT DOCUMENTS

| | | | | |
|---|---|---|---|---|
| 2006/0284105 A1* | 12/2006 | Yamashita | | H01J 37/08 |
| | | | | 250/426 |
| 2009/0230299 A1* | 9/2009 | Shichi | | H01J 37/28 |
| | | | | 250/282 |
| 2011/0226947 A1 | 9/2011 | Takahashi et al. | | |
| 2011/0248179 A1 | 10/2011 | Matesa et al. | | |
| 2013/0220806 A1* | 8/2013 | Iwaya | | H01J 37/20 |
| | | | | 204/298.32 |
| 2016/0126060 A1* | 5/2016 | Fuller | | H01J 37/3005 |
| | | | | 250/492.3 |
| 2017/0125207 A1* | 5/2017 | Swinford | | H01J 37/31 |
| 2017/0221671 A1* | 8/2017 | Asai | | H01J 37/3056 |
| 2018/0301318 A1 | 10/2018 | Iwaya et al. | | |

FOREIGN PATENT DOCUMENTS

| | | |
|---|---|---|
| JP | 1-122556 A | 5/1989 |
| JP | 2002-025493 A | 1/2002 |
| JP | 2009-170117 A | 7/2009 |
| JP | 2009-205937 A | 9/2009 |
| JP | 2013-524467 A | 6/2013 |
| WO | 2012/060416 A1 | 5/2012 |

OTHER PUBLICATIONS

Chinese Office Action dated Mar. 18, 2020 for the Chinese Patent Application No. 201680086672.6.
International Search Report dated Oct. 18, 2016 of International Application No. PCT/JP2016/070846.
German Office Action dated Aug. 30, 2021 for German Patent Application No. 112016007058.6.
Bassim et al., "Recent advances in focused ion beam technology and applications," MRS Bulletin 39 (2014), pp. 317-325.

* cited by examiner

ION MILLING APPARATUS

TECHNICAL FIELD

The present invention relates to an ion milling apparatus.

BACKGROUND ART

The ion milling apparatus is a device for preparing a specimen for examination under a scanning electron microscope, transmission electron microscope or the like. The ion milling apparatus is a process unit which thins the specimen by utilizing a sputtering phenomenon where the specimen is bombarded with accelerated ions such that the ions sputter atoms and molecules. The specimen is processed as follows. A mask as a shielding plate against an ion beam is placed on a top side of the specimen to be processed. A protruded region from an edge face of the mask is sputtered whereby a flat and smooth cross-section along the mask edge face can be obtained. A process object of the ion milling apparatus includes metals, glass, ceramics, electronic components, composite materials and the like. In the case of the electronic components, for example, the ion milling technique is used for various purposes such as acquisition of internal structure and cross-sectional shape, film thickness evaluation, crystalline condition evaluation, failure analysis and cross-sectional analysis of foreign substances. The scanning electron microscopes employ the ion milling apparatus for acquisition of form images, compositional images of specimens and channeling images, X-ray analysis, crystal orientation analysis and the like.

Heretofore, there is known an ion milling apparatus having a configuration which includes: an ion beam source generating an ion beam to be applied to a specimen; a specimen chamber in which the specimen is placed and processed by the ion beam; an exhaust device for exhausting the specimen chamber so as to keep the chamber in vacuum; and a gas injection mechanism for injecting a gas for ion generation. The apparatus is provided with an acceleration electrode which accelerates ions of the ion beam source and also functions as a secondary electron suppressor. Thus, the apparatus has a machine configuration that eliminates the increase in distance between anion gun and the specimen so that a milling processing time can be shortened. Regarding the ion milling apparatus including the ion beam source for radiation of ion beam and a specimen holder for fixing the specimen, Patent Literature 1 discloses an ion milling apparatus featuring a good milling efficiency. This apparatus further includes a mask for covering a part of the specimen and has a configuration where a non-axisymmetric lens is disposed between the ion beam source and the mask.

CITATION LIST

Patent Literature

Patent Literature 1: Japanese Unexamined Patent Application Publication No. 2009-170117

SUMMARY OF INVENTION

Technical Problem

In the above-described ion milling apparatuses, a penning discharge type ion gun having a simple, compact structure is widely used as the ion source. In the existing ion milling apparatuses having no lens mechanism in an ion optical system, the ion beam radiated from anion beam radiation unit spreads out as it goes to the specimen. The ion beam is circularly illuminated onto the specimen and mask.

On the other hand, the non-axisymmetric lens (beam forming electrode) set forth in Patent Literature 1 deforms the ion beam in a manner that the ion beam is spread out along the edge face of the mask and is shortened in a protruding direction of the specimen (direction orthogonal to the mask edge face). The apparatus of the patent literature is adapted to irradiate a wide area of the specimen with the ion beam so as to process the specimen more efficiently than when the circular ion beam is irradiated.

Hence, the inventors have investigated whether or not the configuration set forth in Patent Literature 1 will be utilizable in future years. Consequently, the inventors have found that the non-axisymmetric lens disposed between the ion beam source and the specimen may produce a problem. Specifically, the distance between the ion beam source and the specimen cannot be so large because the larger the distance, the lower the milling performance. It is therefore difficult to provide a sufficient distance between the specimen and the non-axisymmetric lens disposed in between the specimen and the ion beam source. A milled substance is sputtered from the specimen by the applied ion beam and a large amount of milled substance becomes adherent to the non-axisymmetric lens disposed in the proximity of the specimen. It is feared that the contamination deteriorates the function of the non-axisymmetric lens, making it difficult to maintain the performance of the ion milling apparatus.

Accordingly, the present invention has been made in view of the foregoing and an object thereof is to provide an ion milling apparatus adapted to suppress the contamination of the beam forming electrode.

Solution to Problem

According to an aspect of the invention for achieving the object, an ion milling apparatus includes: an ion gun containing therein a beam forming electrode for forming an ion beam; a specimen holder for fixing a specimen to be processed by irradiation of the ion beam; a mask for shielding a part of the specimen from the ion beam; and an ion gun controller for controlling the ion gun.

According to another aspect of the invention, an ion milling apparatus includes: an ion gun containing therein a beam forming electrode for forming an ion beam; a specimen holder for fixing a specimen to be processed by irradiation of the ion beam; a mask for shielding a part of the specimen from the ion beam; an electron microscope column for radiating an electron beam; and an ion gun controller for controlling the ion gun.

Advantageous Effects of Invention

According to the invention, the ion milling apparatus adapted to suppress the contamination of the beam forming electrode can be provided.

DESCRIPTION OF EMBODIMENTS

Figure 3A:
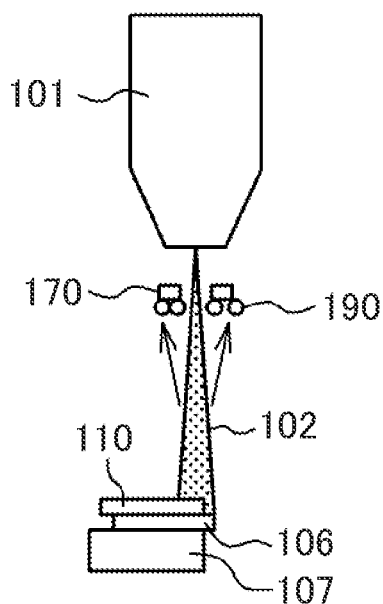
FIG. 3A is a schematic side view for explaining an ion milling apparatus adapted to deform an ion beam by means of a conventional configuration where a beam forming electrode is disposed between the ion gun and a specimen as well as re-adhesion of milled substance, which were investigated by the inventors.
Figure 3B:
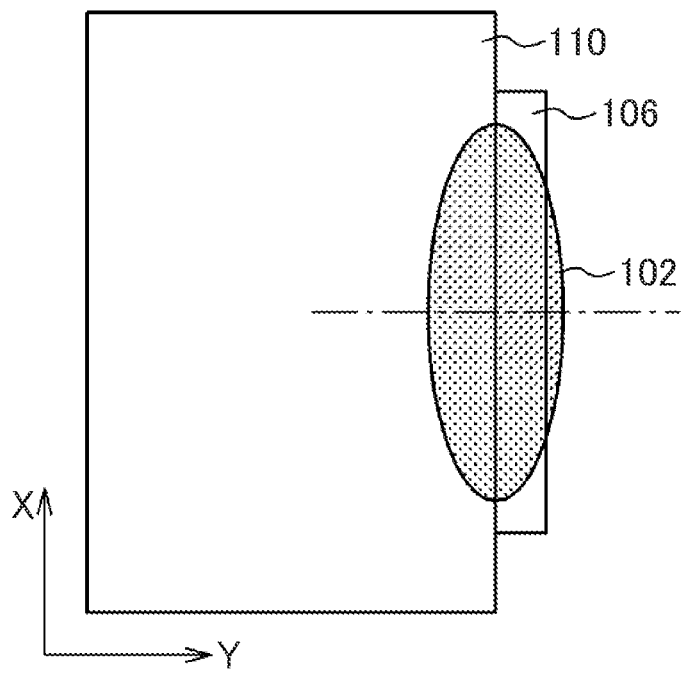
FIG. 3B is a top view showing an example of a shape of ion beam in the ion milling apparatus shown in FIG. 3A.

FIG. 3A is a schematic side view for explaining an ion milling apparatus adapted to deform an ion beam by means of a configuration where a beam forming electrode is disposed between an ion gun and a specimen and also explaining re-adhesion of milled substance, which were investigated by the inventors. FIG. 3B shows an example of a shape of ion beam in the ion milling apparatus shown in FIG. 3A. A beam forming electrode 170 is provided such that an ion beam 102 is elongated in a direction (X direction) along an edge face of a mask 110 and shortened in a direction (Y direction) orthogonal to the edge face of the mask 110 whereby a wide area of the specimen can be irradiated with the ion beam 102 (FIG. 3B). The ion milling apparatus can process the specimen more efficiently than in a case where a circular ion beam is used. In FIG. 3A, a distance between an ion gun 101 and a specimen 106 is shown greater relative to the actual sizes of other components for convenience sake.

As shown in FIG. 3A, however, a large amount of milled substance 190 becomes adherent to the beam forming electrode 170 disposed between the ion gun 101 and the specimen 106 and hence, the electrode often suffers functional deterioration caused by the contamination. The milled substance is sputtered by the radiated ion beam 102. Apparently, therefore, it is difficult to maintain the performance of the ion milling apparatus where the beam forming electrode 170 is disposed between the ion gun 101 and the specimen. If the distance between the ion gun 101 and the specimen 106 is increased for reducing the adherence of the milled substance, there occurs another problem that the milling apparatus is lowered in the milling performance.

Figure 2:
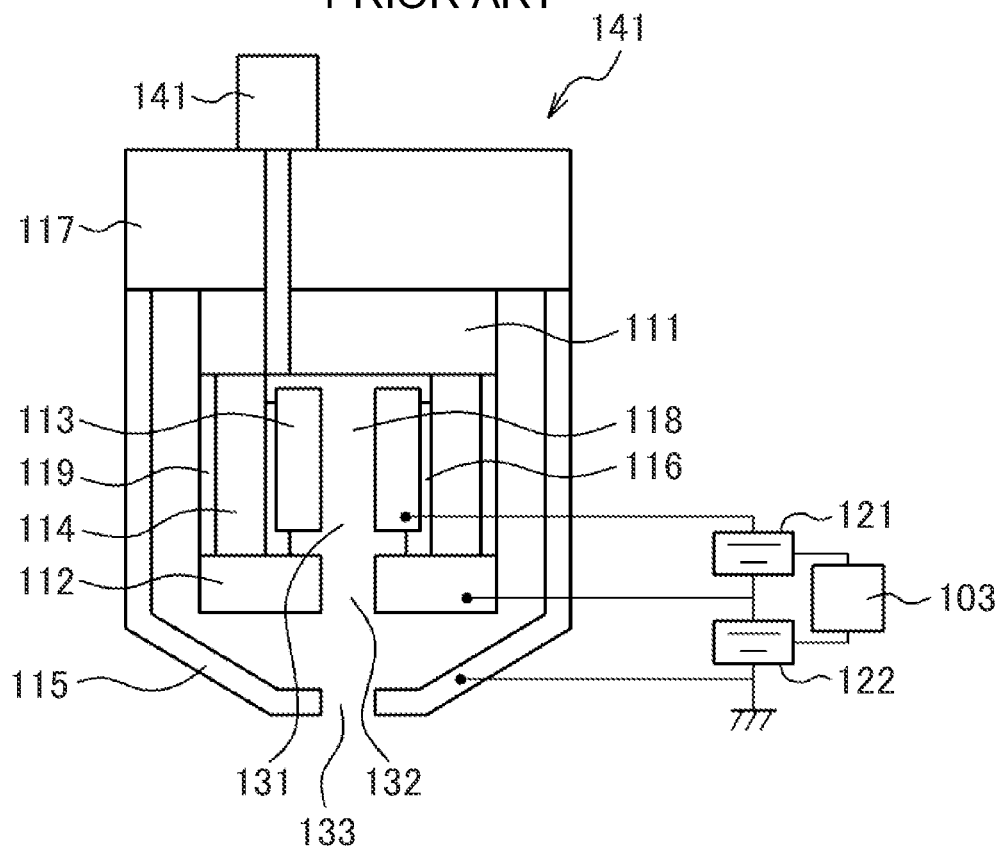
FIG. 2 is a schematic sectional view showing configurations of a conventional penning discharge type ion gun and its associated peripheral part.

The inventors reviewed a structure of the ion gun in order to consider measures for preventing the problem that the milled substance sputtered from the specimen by the ion beam becomes adherent to the beam forming electrode. FIG. 2 is a schematic sectional view showing configurations of a conventional penning discharge type ion gun and its associated peripheral part. The ion gun 101 is a penning discharge type ion gun and includes: a gas supply mechanism 141 for supplying a gas to the inside; an anode 113; a cathode (first cathode) 111 disposed on the side of an ion gun base 117; a cathode (second cathode) 112 disposed on a side to radiate the ion beam; a permanent magnet 114; an acceleration electrode 115; an insulator 116; and a cathode ring 119. The ion gun is fixed to the ion gun base 117. An ion gun controller 103 is electrically connected to a discharge power source 121 and an acceleration power source 122 so as to control discharge voltage and acceleration voltage. The cathode 11 and the cathode 112 are made of pure ferromagnetic iron and form a magnetic circuit jointly with the permanent magnet 114 providing a magnetomotive force. On the other hand, the acceleration electrode 115, the cathode ring 119 and the ion gun base 117 are made of stainless steel (SUS). Hence, these elements along with the insulator 116 made of alumina and the anode 113 made of aluminum are not included in the magnetic circuit. Incidentally, an ionization chamber is indicated at 118, an anode outlet hole is indicated at 131, a cathode outlet hole is indicated at 132, and an acceleration electrode outlet hole is indicated at 133.

After reviewing this ion gun, the inventors realized the use of a space between the cathode 112 disposed on the side to radiate the ion beam and the acceleration electrode 115. The invention is based on the new findings and characterized in that the beam forming electrode is disposed between the cathode (second cathode) 112 and the acceleration electrode.

The beam forming electrode is disposed on the inside of the acceleration electrode (contained in the ion gun) so that the milled substance sputtered by the radiated ion beam is blocked by the acceleration electrode and prevented from becoming adherent to the beam forming electrode. Hence, the functional deterioration caused by the contamination can be suppressed or prevented. Further, the configuration and location of the beam forming electrode can be selected by setting a voltage applied to the beam forming electrode. That is, the beam forming electrode can be located at such a position as to circumvent the influence of internal contamination. Accordingly, an ion milling apparatus featuring high maintainability can be provided.

The embodiments of the invention will hereinbelow be described with reference to the accompanying drawings.

First Embodiment

Figure 1:
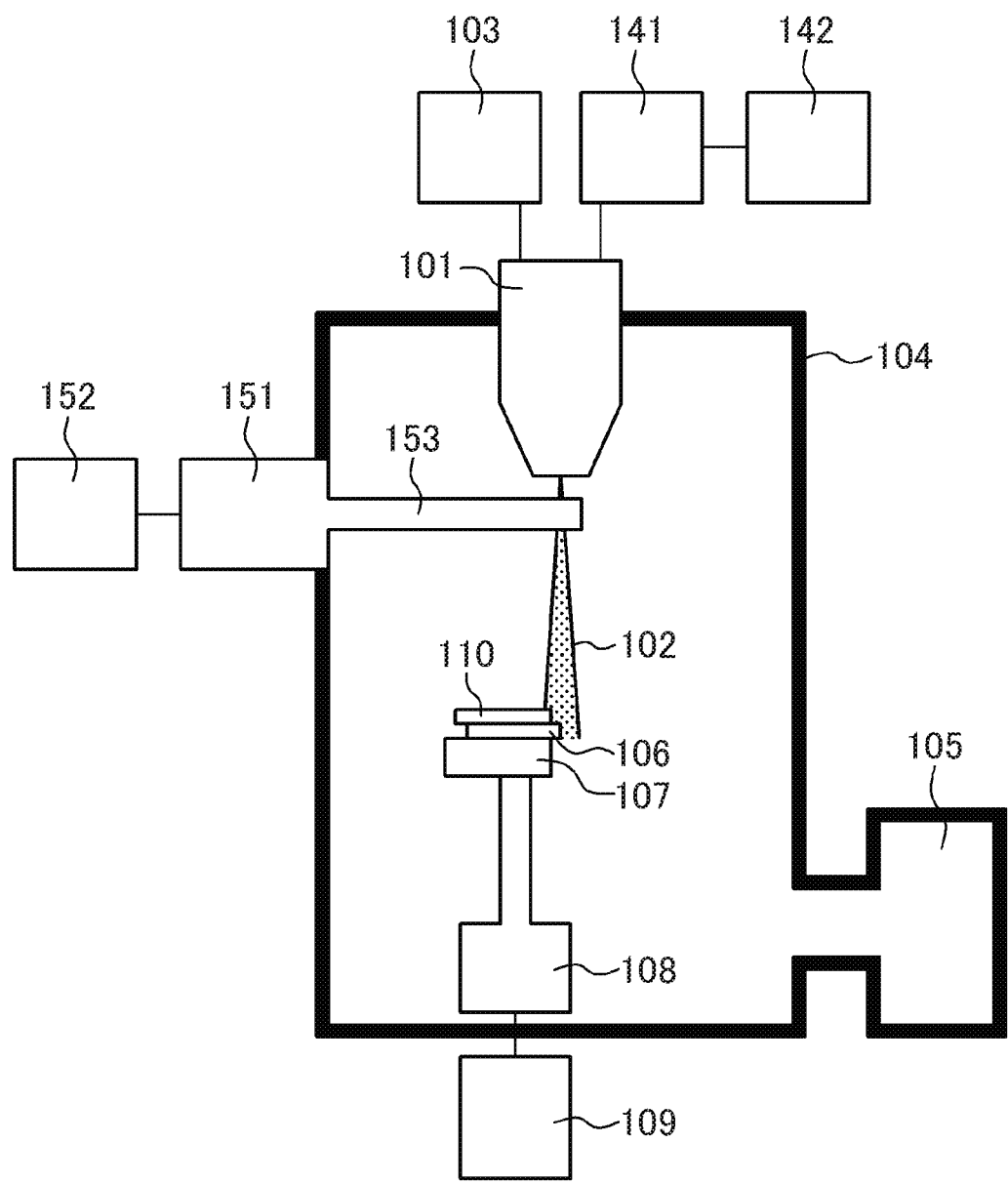
FIG. 1 is a general sectional view schematically showing an exemplary configuration of an ion milling apparatus according to a first embodiment hereof.

FIG. 1 is a general sectional view schematically showing an exemplary configuration of an ion milling apparatus according to a first embodiment hereof. The penning discharge type ion gun 101 contains therein necessary components for ion generation and irradiates the specimen 106 with the ion beam 102. A gas source 142 is connected to the ion gun 101 via the gas supply mechanism 141. A gas mass flow controlled by the gas supply mechanism 141 is supplied to the ionization chamber of the ion gun 101.

A radiation condition of the ion beam 102 is controlled by the ion gun controller 103. An ion beam current of the ion beam 102 is measured by a current measurement unit 151. A current gauge head 153 doubles as a shutter of the ion beam and has a mechanism which is operated by a current gauge head driver 152. A vacuum chamber 104 is controllably kept at atmospheric pressure or evacuated by an evacuation system 105. The specimen 106 is retained on a specimen stub (specimen holder) 107, which is retained by a specimen stage 108. The mask 110 as a shield plate against the ion beam is placed atop the specimen 106. Of the specimen 106, a protruded region from the edge face of the mask 110 is cutoff by the ion beam 102 along the mask edge face. Thus, a smooth cross-section is formed.

The specimen stage 108 can be drawn out of the vacuum chamber 104 when the vacuum chamber 104 is opened to the atmosphere. Further, the specimen stage includes all the mechanical elements required for tilting the specimen 106 at any angle with respect to the optical axis of the ion beam 102. A specimen stage driver 109 can swing the specimen stage 108 from side to side and can control the swing speed. Incidentally, the specimen stage 108 may also be equipped with a cooling mechanism for cooling the specimen.

Figure 4A:
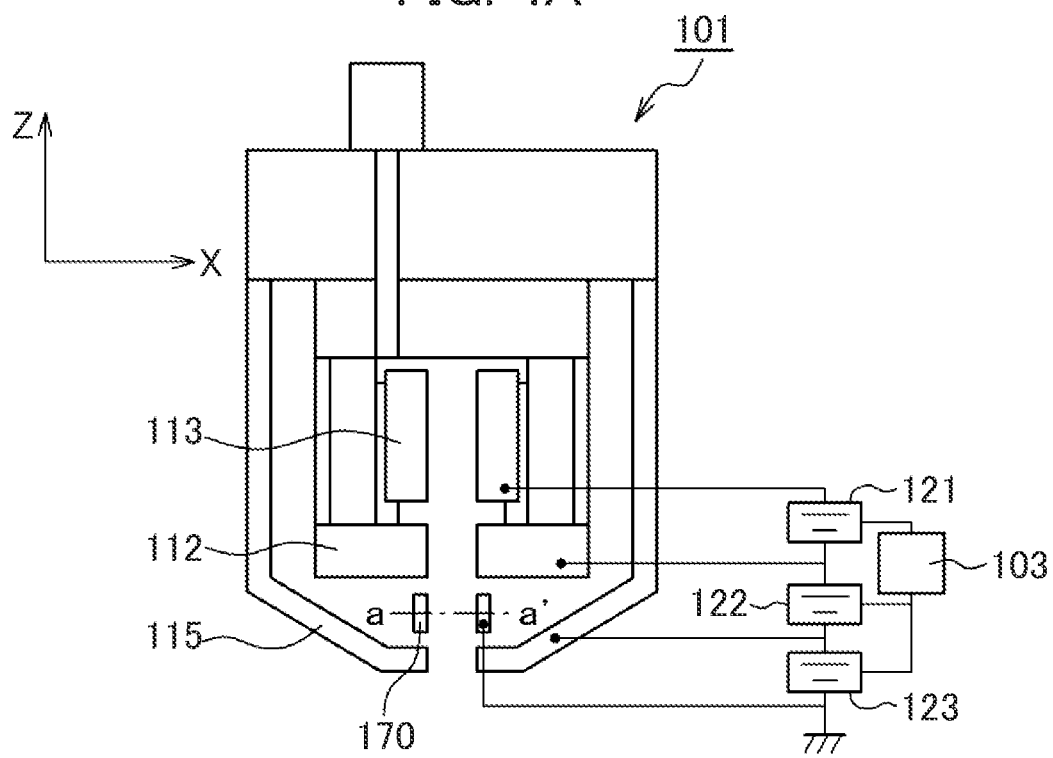
FIG. 4A is a schematic sectional view showing a configuration of the ion gun of the ion milling apparatus according to the first embodiment hereof.
Figure 4B:
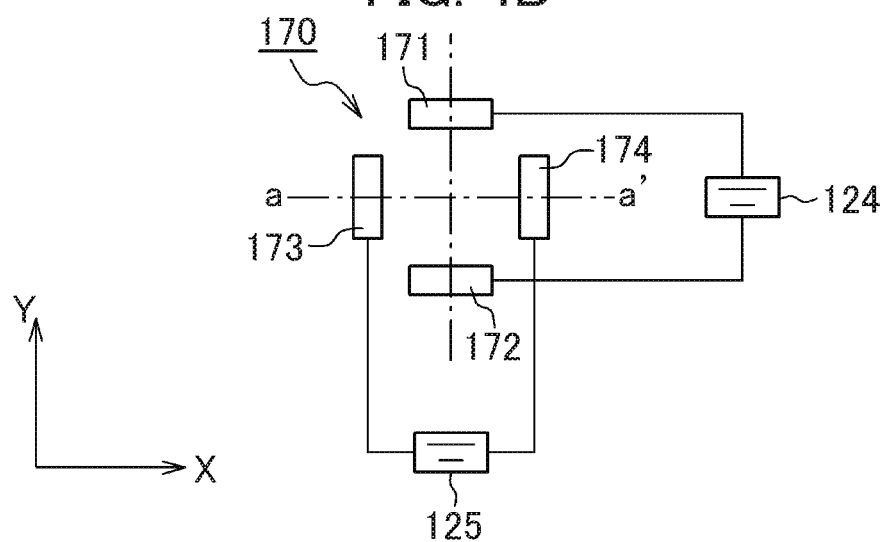
FIG. 4B is a schematic plan view, as taken on the line a-a' in the ion gun shown in FIG. 4A, for explaining a configuration of the beam forming electrode.

FIG. 4A is a sectional view showing configurations of the ion gun and its associated peripheral part. FIG. 4B is a schematic plan view taken on the line a-a' in FIG. 4A for explanation of a layout of the beam forming electrode and a configuration of its peripheral area. The ion gun 101 in the ion milling apparatus of this embodiment is a penning discharge type ion gun where the beam forming electrode 170 including two pairs of electrodes (or four electrodes) is disposed between the acceleration electrode 115 and the cathode 112 disposed on the side to radiate the ion beam.

The ion gun controller 103 is electrically connected to the discharge power source 121, the acceleration power source 122 and a beam forming power source 123 (including 124 and 125) and controls the discharge voltage, the acceleration voltage and a beam forming voltage. The beam forming electrode 170 includes four electrodes 171, 172, 173, 174 shown in FIG. 4B. As shown in the figure, two pairs of electrodes in face-to-face relation are arranged in the X direction and Y direction or on lines bisecting each other at right angles.

The beam forming power source 124 applies a positive voltage to the beam forming electrode 171 and the beam forming electrode 172 opposed to each other in the Y direction, while the beam forming power source 125 applies a negative voltage to the beam forming electrode 173 and the beam forming electrode 174 opposed to each other in the X direction. Such a voltage condition provides a beam profile in which the ion beam spreads out in the X direction but shortens in the Y direction. As just described, an arbitrary ion-beam irradiation range in conformity to a desired processing range of the specimen can be obtained by applying an arbitrary voltage to the beam forming electrode 170.

Further, the embodiment can also provide an ion milling apparatus which can apply a voltage according to a deformation amount of the ion beam by taking a procedure which includes: previously storing, in a storage unit, a relation between a voltage applied to the beam forming electrode disposed inside the ion gun and a deformation amount of the ion beam; and setting a deformation amount of the ion beam through an operation panel.

Figure 5A:
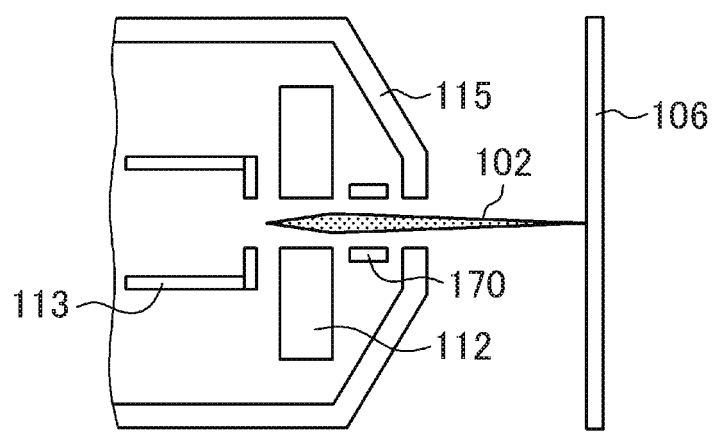
FIG. 5A is a schematic sectional view showing an example of an ion beam profile as viewed in the X direction (direction parallel to a mask edge face) in the ion gun shown in FIG. 4A.
Figure 5B:
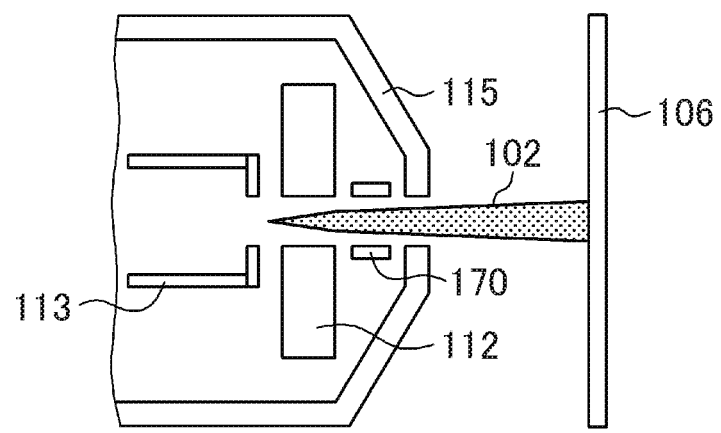
FIG. 5B is a schematic sectional view showing an example of the ion beam profile as viewed in the Y direction (direction orthogonal to the mask edge face) in the ion gun shown in FIG. 4A.

FIG. 5A and FIG. 5B show an example of an ion beam profile in the ion milling apparatus according to the embodiment. The profile is the results of calculation on an ion orbit in the ion gun configuration shown in FIG. 4A and FIG. 4B as performed by an ion optics simulator. FIG. 5A shows a profile on Z-Y plane (profile as viewed in the direction (X-direction) along the mask edge face) while FIG. 5B shows a profile on Z-X plane (profile as viewed in a direction (Y-direction) orthogonal to the mask edge face). The beam forming electrode used in the calculation has: a length of 2.5 mm on Z-axis of FIG. 4A; a length of 3 mm on X-axis of the beam forming electrodes 171 and 172 of FIG. 4B and on Y-axis of the beam forming electrodes 173 and 174 of FIG. 4B; and a distance of 4 mm between the opposed beam forming electrodes 171 and 172 and between the opposed beam forming electrodes 173 and 174. A beam profile having a processing range twice the X-length of that of the conventional profile can be obtained by setting the voltage applied to the beam forming electrode 170 as follows. A voltage of +500V is applied to the beam forming electrodes 171 and 172 arranged in the Y direction while a voltage of −500V is applied to the beam forming electrodes 173 and 174 arranged in the X direction.

Figure 6A:
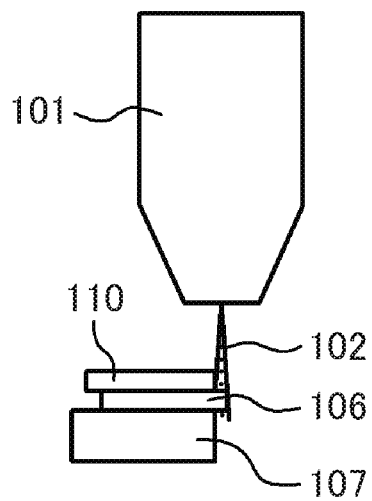
FIG. 6A is a schematic side view for explaining the effect of the ion milling apparatus according to the first embodiment hereof.
Figure 6B:
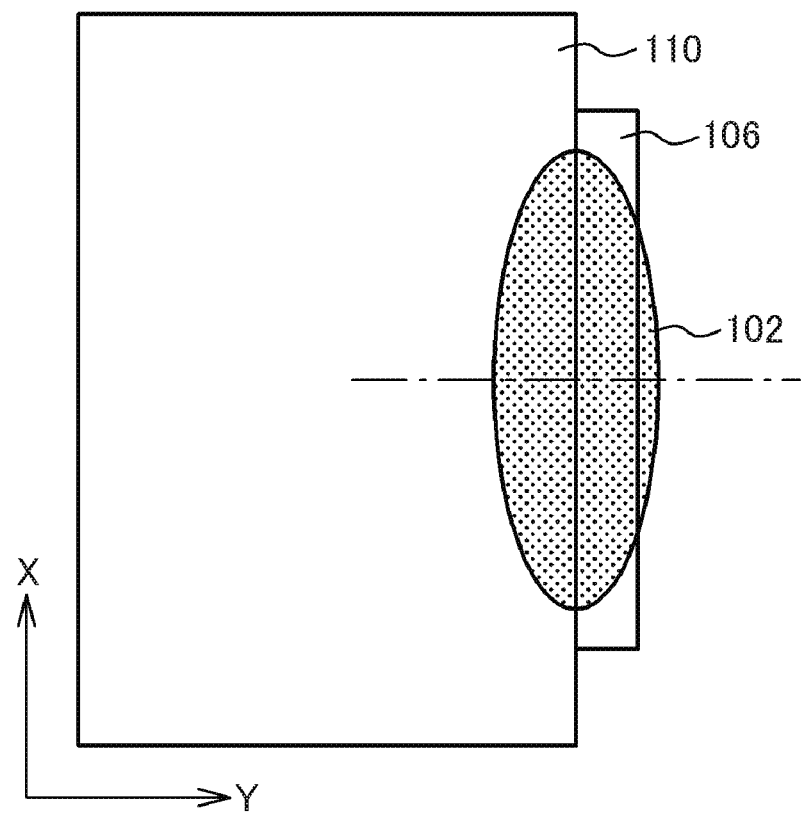
FIG. 6B is a schematic top view showing an example of an ion-beam irradiation range by way of explanation of the effect of the ion milling apparatus according to the first embodiment hereof.

FIG. 6A and FIG. 6B are diagrams showing an example of an ion-beam irradiation range by way of explanation of an effect of the embodiment. FIG. 6A is a side view showing a processing state as seen from a lateral side of an optical path of the ion beam 102. FIG. 6B is a schematic top view showing the specimen 106 and the ion beam 102 illuminated onto the specimen 106 as seen from the ion gun 101. The center position of the ion beam 102 is so adjusted as to fall on the edge of the mask 110. In the case of a beam profile where the ion beam 102 radiated from the ion gun 101 spreads out in the X direction but is shortened in the Y direction, as shown in the figure, the electric field converges much of the ion beam 102 on the specimen 106. Hence, the apparatus can process the specimen on a larger area and in a shorter time than before, achieving enhanced processing efficiency.

Figure 7A:
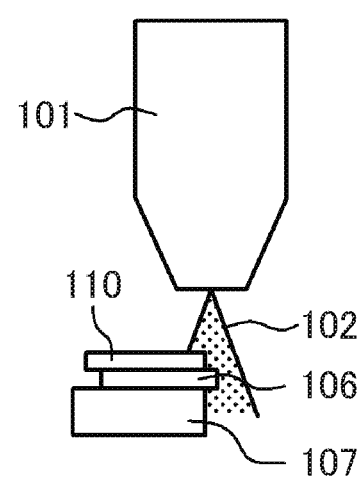
FIG. 7A is a schematic side view for explaining the effect of the ion milling apparatus according to the first embodiment hereof.
Figure 7B:
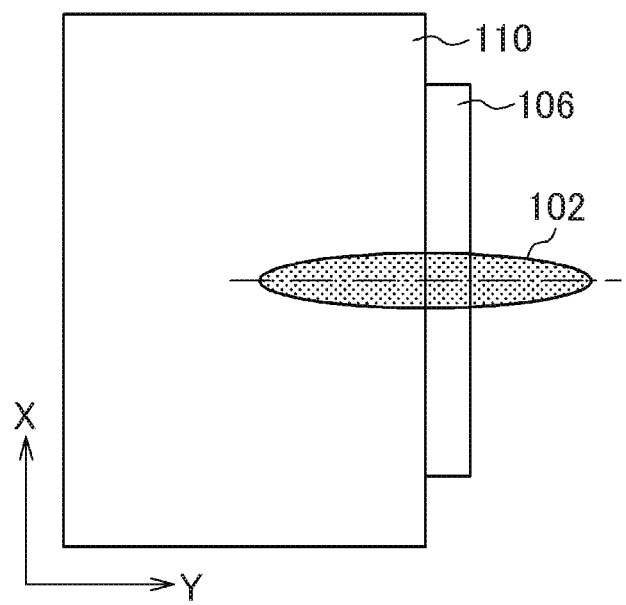
FIG. 7B is a top view showing an example of the ion-beam irradiation range by way of explanation of the effect of the ion milling apparatus according to the first embodiment hereof.

FIG. 7A and FIG. 7B are diagrams showing an example of the ion-beam irradiation range by way of explanation of another effect of the embodiment. FIG. 7A is a side view showing a processing state as seen from a lateral side of the optical path of the ion beam 102. FIG. 7B is a view showing the specimen 106 and the ion beam 102 illuminated onto the specimen 106 as seen from the ion gun 101. In the case of a beam profile where the ion beam 102 radiated from the ion gun 101 spreads out in the Y direction but is shortened in the X direction, as shown in the figures, the ion-beam irradiation range on the specimen is reduced so that the ion beam illuminated onto an area outside the desired processing range can be reduced as compared with a case where a conventional circular beam is used. This is effective to reduce processing failure such as deformation or melt of the specimen caused by heat energy. Further, it is also possible to use this configuration in combination with the cooling mechanism provided at the specimen stage or the like.

Furthermore, if a low acceleration voltage condition is selected, the region irradiated with the ion beam 102 further spreads out in the Y-direction. Hence, specimen breakage caused by the heat energy diffused from the ion beam illuminated onto the area outside the desired processing range can be reduced. Accordingly, the apparatus can process a material more vulnerable to heat damage.

In the ion beam source (ion gun), the beam forming electrode consisting of two pairs of opposed electrodes (four electrodes) is disposed between the cathode electrode disposed on the side to radiate the ion beam and the acceleration electrode, and an arbitrary voltage is applied to the beam forming electrodes in orthogonality relation. In this way, the ion milling apparatus adapted to form the ion beam in conformity to the desired processing range of the specimen can be provided.

The specimens were processed by the ion milling apparatus shown in FIG. 1 which was equipped with the ion gun shown in FIG. 4A. As the result, the adherence of milled substance to the beam forming electrode was notably reduced as compared with the case where the beam forming electrode is disposed between the ion gun and the specimen. As shown in FIG. 6B, the beam of the shape elongated in the direction along the mask edge but shortened in the direction orthogonal to the mask edge was used. For example, the ion beam was formed in a manner that the major axis of an elliptical shape was conformed with the mask edge. In this manner, the ion milling apparatus could increase the efficiency of processing the specimen in a state where the contamination of the beam forming electrode was suppressed. Further, as shown in 7B, the beam of the shape shortened in the direction along the mask edge but elongated in the direction orthogonal to the mask edge was used. For example, the ion beam was formed in a manner that the major axis of an elliptical shape was orthogonal to the mask edge. In this manner, the ion milling apparatus could suppress the heating of the specimen in a state where the contamination of the beam forming electrode was suppressed. This permits the processing of a specimen vulnerable to heat damage.

As described above, the embodiment can provide the ion milling apparatus adapted to suppress the contamination of the beam forming electrode. In the inside of the ion beam source, the beam forming electrode is disposed between the cathode electrode on the side to radiate the ion beam and the acceleration electrode while an arbitrary voltage is applied to the beam forming electrode whereby an ion beam can be formed in conformity to the desired processing range of the specimen. In this manner, the embodiment can provide the ion milling apparatus which can perform the ion milling processing with high efficiency or the ion milling processing on the material vulnerable to the heat damage in the state where the contamination of the beam forming electrode is suppressed.

Second Embodiment

An ion milling apparatus according to a second embodiment hereof is described with reference to FIG. 8. It is noted that an item described in the first embodiment but not described in this embodiment is also applicable to this embodiment unless otherwise stated.

Figure 8:
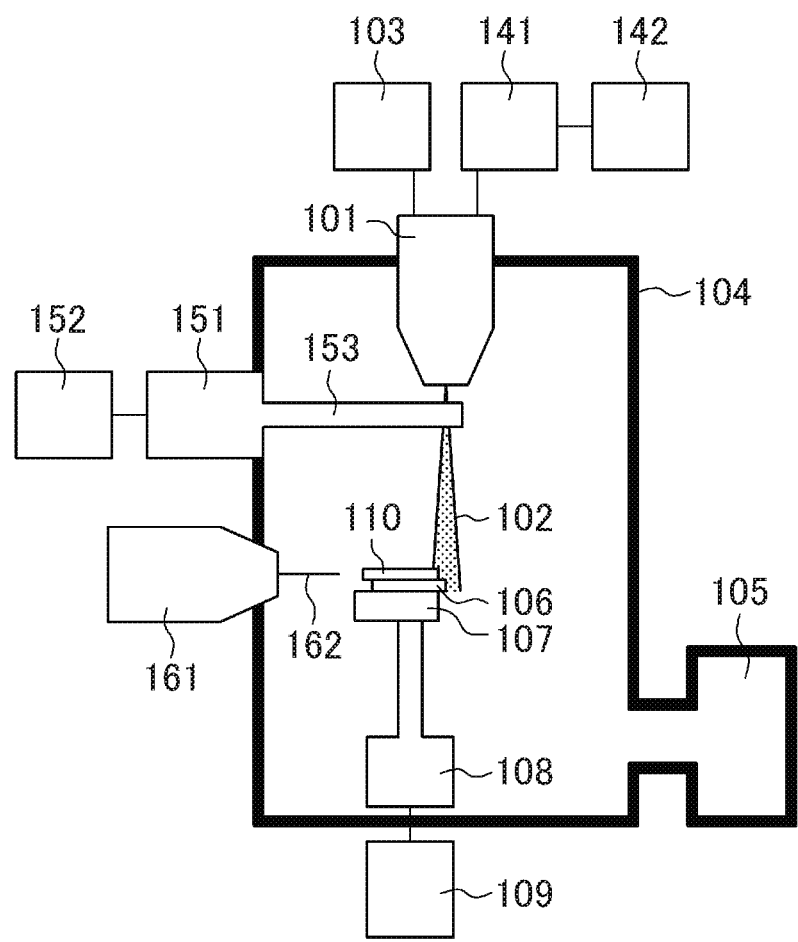
FIG. 8 is a general sectional view schematically showing an exemplary configuration of an ion milling apparatus according to a second embodiment hereof.

FIG. 8 is a general sectional view schematically showing a configuration of an ion milling apparatus according to this embodiment. This embodiment illustrates an example where an electron microscope such as SEM is mounted to the ion milling apparatus. The penning discharge type ion gun 101 contains therein components required for generating ions, forming an irradiation system for irradiating the specimen 106 with the ion beam 102. An electron microscope column 161 contains therein components required for generating an electron beam 162, forming an irradiation system for irradiating the specimen 106 with the electron beam 162. The gas source 142 is connected to the ion gun 101 via the gas supply mechanism 141. A gas mass flow controlled by the gas supply mechanism 141 is supplied to the ionization chamber of the ion gun 101.

The radiation condition of the ion beam 102 is controlled by the ion gun controller 103. An ion beam current of the ion beam 102 is measured by the current measurement unit 151. The current gauge head 153 doubles as a shutter of the ion beam and has a mechanism which is operated by the current gauge head driver 152. The vacuum chamber 104 is controllably kept at atmospheric pressure or evacuated by the evacuation system 105. The specimen 106 is retained on the specimen stub 107, which is retained by the specimen stage 108.

The specimen stage 108 can be drawn out of the vacuum chamber 104 when the vacuum chamber 104 is opened to the atmosphere. Further, the specimen stage includes all the mechanical elements required for tilting the specimen 106 at any angle with respect to the optical axis of the ion beam 102. The specimen stage driver 109 can swing the specimen stage 108 from side to side and can control the swing speed.

The ion milling apparatus equipped with the electron microscope has a configuration suited to a case where the apparatus has a beam forming mechanism. In the case of the ion-beam irradiation range shown in FIG. 6B, for example, the ion beam 102 radiated from the ion gun 101 has a beam profile shortened in the Y direction, requiring very high accuracy alignment. The ion milling apparatus equipped with the electron microscope is adapted for ultrahigh accuracy alignment using the electron microscope mechanism. According to the embodiment, the ion milling apparatus can easily accomplish the high accuracy alignment of the formed ion beam 102 with the mask edge and hence, a large portion of the ion beam 102 can be intensively applied onto the specimen 106. In a case where the apparatus applies the major axis of the elliptical beam, a larger area of the specimen can be processed quickly, resulting in an increased processing efficiency. In a case where the ion milling apparatus is equipped with the electron microscope, the acceleration electrode may preferably be formed of a ferromagnetic material in consideration of the electron beam affected by the magnetic field leaked from the ion gun.

Figure 9A:
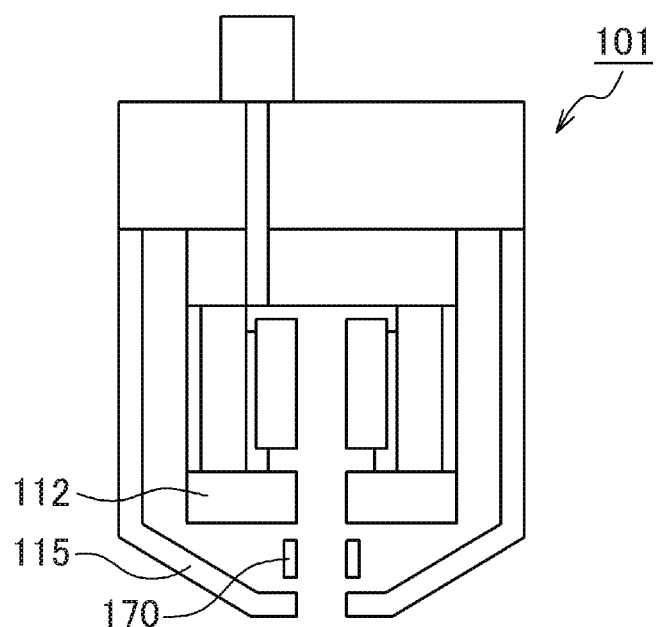
FIG. 9A is a schematic sectional view showing an example of an ion gun in the ion milling apparatus shown in FIG. 8.
Figure 9B:
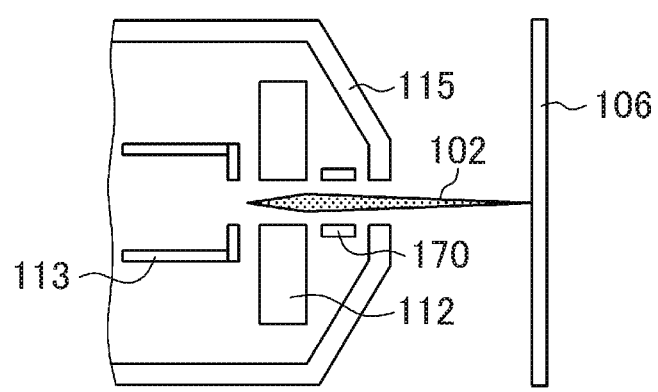
FIG. 9B is a schematic sectional view showing an example of an ion beam profile as viewed in the X direction (direction parallel to a mask edge face) in the ion gun shown in FIG. 9A.
Figure 9C:
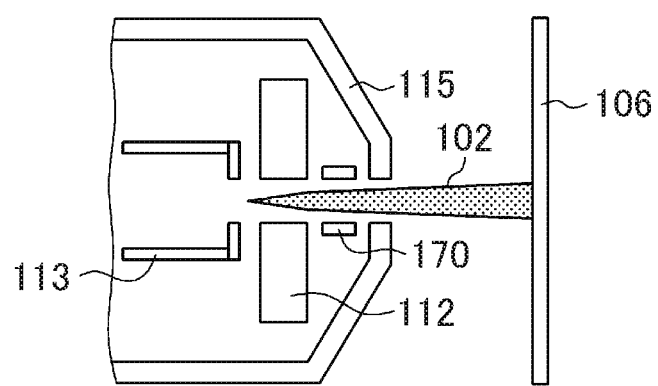
FIG. 9C is a schematic sectional view showing an example of the ion beam profile as viewed in the Y direction (direction orthogonal to the mask edge face) in the ion gun shown in FIG. 9A.

FIG. 9A to FIG. 9C diagrammatically show another example of the ion gun structure and the ion beam profile according to the embodiment. FIG. 9A is a sectional view showing the ion gun 101. FIG. 9B and FIG. 9C show the results of calculation on an ion orbit as performed by the ion optics simulator. FIG. 9B shows a profile on Z-Y plane (profile as viewed in the direction along the mask edge face (X direction)), while FIG. 9C shows a profile on Z-X plane (profile as viewed in the direction orthogonal to the mask edge face (Y direction)).

The ion gun 101 according to the embodiment is characterized in that the beam forming electrode 170 including two pairs (four) of electrodes is disposed between the acceleration electrode 115 and the cathode 112 disposed on the side to radiate the ion beam. The beam forming electrode 170 consists of the four electrodes 171, 172, 173, 174. Two pairs of electrodes in face-to-face relation are arranged in the X direction and Y direction or on lines bisecting each other at right angles (see FIG. 4A, FIG. 4B). The beam forming electrode used in the ion orbit calculation has: a length of 1.5 mm in the Z-axis direction shown in FIG. 4A; a length of 3 mm in the X-axis direction for the beam forming electrodes 171 and 172 shown in FIG. 4B and a length of 3 mm in the Y-axis direction for the beam forming electrodes 173 and 174 shown in FIG. 4B.

FIG. 9A to FIG. 9C illustrate the case where a distance between the opposed beam forming electrodes 171 and 172 and between the opposed beam forming electrodes 173 and 174 is 6 mm. The figures show that a beam profile defining a processing region spread out in the X direction can be obtained by applying +1800V to the beam forming electrodes 171 and 172 arranged in the Y direction and applying −1800V to the beam forming electrodes 173 and 174 arranged in the X direction.

The layout condition of and the voltage applied to the beam forming electrode were evaluated using the ion optics simulator and the results are listed in Table 1. The beam forming electrode 170 used for the evaluation consists of the four electrodes 171, 172, 173, 174 which are arranged such that two pairs of opposed electrodes are arranged in in the X direction and Y direction or on the lines bisecting each other at right angles. The beam forming electrode has: a length of 1.5 mm in the Z-axis direction shown in FIG. 4A; a length of 3 mm in the X-axis direction for the beam forming electrodes 171 and 172 shown in FIG. 4B and a length of 3 mm in the Y-axis direction for the beam forming electrodes 173 and 174 shown in FIG. 4B. The distance between the opposed beam forming electrodes 171 and 712 and between the opposed beam forming electrodes 173 and 714 was evaluated so as to optimize the voltages applied to the beam forming electrodes when the distance between the opposed electrodes was set to 3 mm, 4 mm, 5 mm and 6 mm.

TABLE 1

| | distance between BFEs (mm) | | | |
|---|---|---|---|---|
| | 6 | 5 | 4 | 3 |
| voltage(V) on BFEs 171, 172 | +(600~1800) | +(400~1200) | +(300~700) | +(200~400) |
| voltage(V) on BFEs 173, 174 | −(600~1800) | −(400~1200) | −(300~700) | −(200~400) |

BFE: beam forming electrode

A criterion for deciding the effectiveness of beam formation was that a beam width in the spreading direction is twice the beam width in the shortening direction. In a case where a voltage applied to the beam forming electrode is lower than the range of voltage application shown in Table 1, a sufficient effect of beam formation cannot be obtained. In a case where a voltage applied to the beam forming electrode is higher than the range of voltage application, crossover occurs on the ion beam orbit. According to the embodiment, the beam forming electrode having the configuration shown in Table 1 is disposed in the ion beam source (ion gun) at place between the cathode electrode on the side to radiate the ion beam and the acceleration electrode. In this arrangement, an ion beam can be formed in conformity to the desired processing range of the specimen by applying voltages listed in Table 1 to the beam forming electrodes. Thus, the embodiment can provide the ion milling apparatus which can perform the ion milling processing with high efficiency or the ion milling processing on the material vulnerable to the heat damage.

Further, the embodiment can also provide the ion milling apparatus which can apply a voltage according to a deformation amount of the ion beam by taking the procedure which includes: previously storing, in the storage unit, the relation between a voltage applied to the beam forming electrode disposed in the ion gun and a deformation amount of the ion beam; and setting a deformation amount of the ion beam through the operation panel.

The specimens were processed by the ion milling apparatus shown in FIG. 8 which was equipped with the ion gun shown in FIG. 9A. As the result, the adherence of milled substance to the beam forming electrode was notably reduced as compared with the case where the beam forming electrode is disposed between the ion gun and the specimen. As shown in FIG. 6B, the beam of the shape elongated in the direction along the mask edge but shortened in the direction orthogonal to the mask edge was used. For example, the ion beam was formed in the manner that the major axis of the elliptical shape was conformed with the mask edge. In this manner, the ion milling apparatus could increase the efficiency of processing the specimen in the state where the contamination of the beam forming electrode was suppressed. In this case, the alignment between the ion beam with the mask edge was easily accomplished by using the electron microscope mounted in the ion milling apparatus. Further, as shown in 7B, the beam of the shape shortened in the direction along the mask edge but elongated in the direction orthogonal to the mask edge was used. For example, the ion beam was formed in the manner that the major axis of an elliptical shape was orthogonal to the mask edge. In this manner, the ion milling apparatus could suppress the heating of the specimen in the state where the contamination of the beam forming electrode was suppressed. This permits the processing of a specimen vulnerable to heat damage.

As described above, this embodiment can achieve the same effects as those of the first embodiment. With the electron microscope such as SEM added thereto, the ion milling apparatus of the embodiment can easily accomplish the alignment between the mask edge and the ion beam.

Third Embodiment

An ion milling apparatus according to a third embodiment hereof is described with reference to FIG. 10A and FIG. 10B. It is noted that an item described in the first and second embodiments but not described in this embodiment is also applicable to this embodiment unless otherwise stated.

Figure 10A:
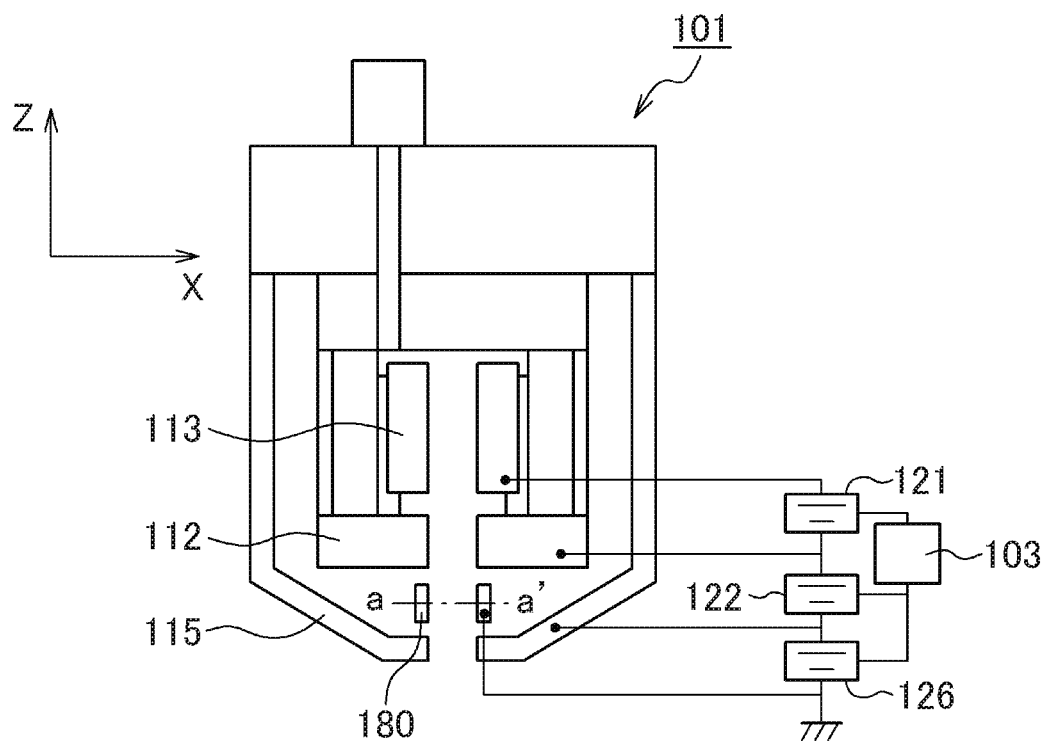
FIG. 10A is a schematic sectional view showing a configuration of an ion gun of an ion milling apparatus according to a third embodiment hereof.
Figure 10B:
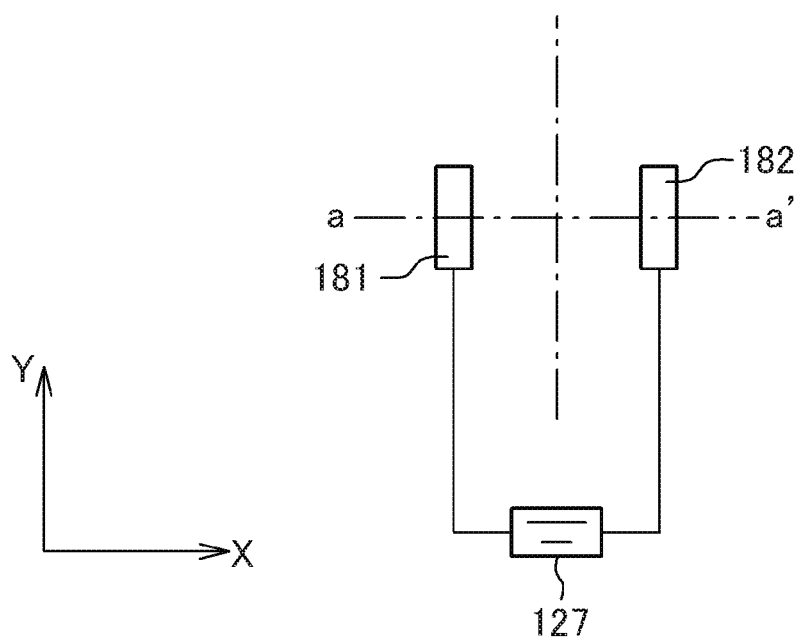
FIG. 10B is a schematic plan view, as taken on the line a-a' in the ion gun shown in FIG. 10A, for explaining a configuration of a beam forming electrode.

FIG. 10A and FIG. 10B are structure diagrams showing an example of an ion gun of an ion milling apparatus according to the embodiment hereof. The ion milling apparatus can employ the apparatus having the configuration shown in FIG. 1 or FIG. 8. FIG. 10A is a schematic sectional view showing configurations of an ion gun 101 and its associated peripheral part. FIG. 10B is a diagram showing a layout of a beam forming electrode and a configuration of its associated peripheral part as taken on the line a-a' in FIG. 10A. The ion gun 101 according to the embodiment is characterized in that a beam forming electrode 180 including a pair (two) of electrodes is disposed between the acceleration electrode 115 and the cathode 112 disposed on the side to radiate the ion beam. The ion gun controller 103 is electrically connected to the discharge power source 121, the acceleration power source 122 and a beam forming power source 126 (including 127) and controls the discharge voltage, the acceleration voltage and the beam forming voltage. The beam forming electrode 180 includes two electrodes 181, 182. As shown in the figure, the pair of electrodes in face-to-face relation is arranged in the X direction. A beam forming power source 127 applies a minus voltage to the beam forming electrode 181 and the beam forming electrode 182 opposed to each other in the X direction. Such a voltage condition provides an ion beam having a beam profile spread out in the X direction. In this manner, an ion-beam irradiation range conforming to the desired processing range of the specimen can be obtained by applying an arbitrary voltage to the beam forming electrode.

The specimens were processed by the ion milling apparatus shown in FIG. 1 or FIG. 8 which was equipped with the ion gun shown in FIG. 10A. As the result, the adherence of milled substance to the beam forming electrode was notably reduced as compared with the case where the beam forming electrode is disposed between the ion gun and the specimen. By adopting the ion beam having the shape elongated along the mask edge and shortened in the direction orthogonal to the mask edge, the above ion milling apparatus could achieve the increased efficiency of processing the specimen in the state where the contamination of the beam forming electrode was suppressed. Further, by adopting the ion beam having the shape shortened along the mask edge and elongated in the direction orthogonal to the mask edge, the above ion milling apparatus could suppress the heating of the specimen during the ion milling process in the state where the contamination of the beam forming electrode was suppressed. This permits the processing of the specimen vulnerable to heat damage.

As described above, this embodiment can achieve the same effects as those of the first and second embodiments. Further, the ion milling apparatus can be simplified in structure by forming the beam forming electrode of a pair (two) of electrodes.

The invention is not limited to the foregoing embodiments but can include a variety of modifications. The foregoing embodiments are the detailed illustrations to clarify the invention. The invention is not necessarily limited to what includes all the components described above. Some component of one embodiment can be replaced by some component of another embodiment. Further, some component of one embodiment can be added to the arrangement of another embodiment. A part of the arrangement of each embodiment permits addition of some component of another embodiment, the omission thereof or replacement thereof.

LIST OF REFERENCE SIGNS

1 . . . ion gun
102 . . . ion beam
103 . . . ion gun controller
104 . . . vacuum chamber
105 . . . evacuation system
106 . . . specimen
107 . . . specimen stub (specimen holder)
108 . . . specimen stage
109 . . . specimen stage driver
110 . . . ion beam mask
111 . . . cathode (first cathode) disposed on the side of ion gun base
112 . . . cathode (second cathode) disposed on a side to radiate ion beam
113 . . . anode
114 . . . permanent magnet
115 . . . acceleration electrode
116 . . . insulator
117 . . . ion gun base
118 . . . ionization chamber
119 . . . cathode ring
121 . . . discharge power source
122 . . . acceleration power source
123,124,125,126,127 . . . beam forming power source
131 . . . anode outlet hole
132 . . . cathode outlet hole
133 . . . acceleration electrode outlet hole
141 . . . gas supply mechanism
142 . . . gas source
151 . . . current measurement unit
152 . . . current gauge head driver
153 . . . current gauge head
161 . . . electron microscope column
162 . . . electron beam
170,171,172,173,174 . . . four-piece type beam forming electrode
180,181,182 . . . two-piece type beam forming electrode
190 . . . milled substance

The invention claimed is:

1. An ion milling apparatus comprising:
an ion gun containing therein a beam forming electrode for forming an ion beam;
a specimen holder for fixing a specimen to be processed by irradiation of the ion beam;
a mask for shielding a part of the specimen from the ion beam; and
an ion gun controller for controlling the ion gun,
wherein the ion gun includes:
   an anode disposed inside the ion gun;
   a permanent magnet disposed around the anode via an insulator;
   a cathode ring disposed around the permanent magnet;
   a first cathode and a second cathode disposed at places above and below the anode and connected to the cathode ring; and
   an acceleration electrode disposed in a manner to cover the first cathode, the second cathode and the cathode ring and operative to accelerate generated ions for radiating the ions to the outside of the ion gun, and
   the beam forming electrode is disposed between the acceleration electrode and the second cathode disposed on the side of the acceleration electrode.

2. The ion milling apparatus according to claim 1, wherein the ion gun is a penning discharge type ion gun.

3. The ion milling apparatus according to claim 1, wherein the beam forming electrode includes at least one pair of electrodes opposed to each other.

4. The ion milling apparatus according to claim 3, wherein the beam forming electrode includes two pairs of electrodes, each pair of electrodes opposed to each other, and the two pairs of electrodes are arranged on lines orthogonal to each other.

5. The ion milling apparatus according to claim 4, wherein based on a relation between a voltage applied to the beam forming electrode and a deformation amount of the ion beam, the relation stored in a storage unit, the ion gun controller provides control in which a predetermined voltage is applied to the beam forming electrode according to a set deformation amount of the ion beam.

6. The ion milling apparatus according to claim 4, wherein the ion gun controller controls the beam forming electrode to form the ion beam elongated in a direction of an edge face of the mask and shortened in a direction orthogonal to the edge face of the mask.

7. The ion milling apparatus according to claim 4, wherein the ion gun controller controls the beam forming electrode to form the ion beam shortened in a direction of an edge face of the mask and elongated in a direction orthogonal to the edge face of the mask.

8. An ion milling apparatus comprising:
an ion gun containing therein a beam forming electrode for forming an ion beam;
a specimen holder for fixing a specimen to be processed by irradiation of the ion beam;
a mask for shielding a part of the specimen from the ion beam;
an electron microscope column for radiating an electron beam; and
an ion gun controller for controlling the ion gun,
wherein the ion gun includes:
  an anode disposed inside the ion gun;
  a permanent magnet disposed around the anode via an insulator;
  a cathode ring disposed around the permanent magnet;
  a first cathode and a second cathode disposed at places above and below the anode and connected to the cathode ring; and
  an acceleration electrode disposed in a manner to cover the first cathode, the second cathode and the cathode ring and operative to accelerate generated ions for radiating the ions to the outside of the ion gun, and
the beam forming electrode is disposed between the acceleration electrode and the second cathode disposed on the side of the acceleration electrode.

9. The ion milling apparatus according to claim 8, wherein the acceleration electrode is formed of a ferromagnetic material.

10. The ion milling apparatus according to claim 8, wherein the beam forming electrode includes two pairs of electrodes, each pair of electrodes opposed to each other, and the two pairs of electrodes are arranged on lines orthogonal to each other, and
wherein the ion gun controller controls the beam forming electrode to form the ion beam elongated in a direction of an edge face of the mask and shortened in a direction orthogonal to the edge face of the mask.

11. The ion milling apparatus according to claim 8, wherein the beam forming electrode includes two pairs of electrodes, each pair of electrodes opposed to each other, and the two pairs of electrodes are arranged on lines orthogonal to each other, and
wherein the ion gun controller controls the beam forming electrode to form the ion beam shortened in a direction of an edge face of the mask and elongated in a direction orthogonal to the edge face of the mask.

* * * * *